(12) United States Patent
Arnout

(10) Patent No.: US 10,334,675 B2
(45) Date of Patent: Jun. 25, 2019

(54) SWITCH

(71) Applicant: Klaas Arnout, Merelbeke (BE)

(72) Inventor: Klaas Arnout, Merelbeke (BE)

(73) Assignee: MANZANA BVBA, Merelbeke (BE)

( * ) Notice: Subject to any disclaimer, the term of this patent is extended or adjusted under 35 U.S.C. 154(b) by 1119 days.

(21) Appl. No.: 13/950,699

(22) Filed: Jul. 25, 2013

(65) Prior Publication Data

US 2014/0028215 A1    Jan. 30, 2014

(30) Foreign Application Priority Data

Jul. 26, 2012 (BE) .................................. 2012/0520

(51) Int. Cl.
  *H03K 17/96* (2006.01)
  *H05B 33/08* (2006.01)

(52) U.S. Cl.
  CPC ....... *H05B 33/0842* (2013.01); *H03K 17/962* (2013.01); *H05B 33/0863* (2013.01); *H03K 2217/960735* (2013.01); *H03K 2217/960755* (2013.01)

(58) Field of Classification Search
  CPC .......................... H05B 33/0842; H05B 41/38
  USPC .................................. 315/325, 291; 362/231
  See application file for complete search history.

(56) References Cited

U.S. PATENT DOCUMENTS

| | | | |
|---|---|---|---|
| 6,577,080 B2 * | 6/2003 | Lys et al. ....................... | 315/362 |
| 7,014,336 B1 * | 3/2006 | Ducharme ......... | H05B 33/0857 |
| | | | 362/231 |
| 7,173,384 B2 * | 2/2007 | Plotz et al. .................... | 315/291 |
| 7,354,172 B2 * | 4/2008 | Chemel et al. ............... | 362/231 |
| 7,598,859 B2 * | 10/2009 | Laski et al. ................. | 340/539.3 |
| 7,948,394 B2 * | 5/2011 | Bergman et al. ........ | 340/815.65 |
| 8,344,639 B1 * | 1/2013 | Bahrehmand ................. | 315/247 |
| 2008/0180042 A1 * | 7/2008 | Smith et al. .................. | 315/307 |
| 2009/0072765 A1 * | 3/2009 | DeBock ........................ | 315/325 |
| 2009/0200967 A1 * | 8/2009 | Bergman ........... | H05B 33/0863 |
| | | | 315/363 |
| 2010/0066267 A1 * | 3/2010 | Meyer .......................... | 315/294 |
| 2010/0219760 A1 * | 9/2010 | Tanaka et al. ................ | 315/152 |
| 2010/0296285 A1 * | 11/2010 | Chemel et al. ............... | 362/235 |
| 2011/0050124 A1 * | 3/2011 | Bailey et al. ................. | 315/294 |
| 2011/0062888 A1 * | 3/2011 | Bondy et al. ................. | 315/294 |
| 2011/0069094 A1 * | 3/2011 | Knapp .......................... | 345/690 |
| 2011/0254450 A1 * | 10/2011 | Bergholz et al. ............. | 315/121 |
| 2011/0260647 A1 * | 10/2011 | Catalano et al. ............. | 315/294 |
| 2011/0291570 A1 * | 12/2011 | Sinai et al. ................... | 315/149 |
| 2012/0001569 A1 * | 1/2012 | Christoph et al. ............ | 315/294 |
| 2012/0025738 A1 * | 2/2012 | Beiner ......................... | 315/312 |
| 2012/0235579 A1 * | 9/2012 | Chemel et al. ............... | 315/152 |
| 2013/0077299 A1 * | 3/2013 | Hussell et al. ................ | 362/231 |
| 2013/0088154 A1 * | 4/2013 | Van Hoof et al. ............ | 315/152 |
| 2013/0113397 A1 * | 5/2013 | Salter et al. .................. | 315/362 |
| 2013/0127744 A1 * | 5/2013 | Shakya et al. ................ | 345/173 |
| 2013/0127879 A1 * | 5/2013 | Burns et al. .................. | 345/501 |
| 2013/0169796 A1 * | 7/2013 | Van Der Burgt et al. .... | 348/135 |
| 2013/0181613 A1 * | 7/2013 | Schweninger ................ | 315/151 |
| 2013/0249410 A1 * | 9/2013 | Thompson .................... | 315/158 |
| 2013/0314312 A1 * | 11/2013 | Gruhlke et al. .............. | 345/156 |
| 2014/0001962 A1 * | 1/2014 | Harris .......................... | 315/153 |
| 2014/0091731 A1 * | 4/2014 | Fushimi ....................... | 315/292 |

(Continued)

*Primary Examiner* — Wei (Victor) Chan

(74) *Attorney, Agent, or Firm* — Nixon & Vanderhye P.C.

(57) ABSTRACT

The invention comprises a switch suitable for forwarding at least two functions to a lighting system.

15 Claims, 7 Drawing Sheets

(56) References Cited

U.S. PATENT DOCUMENTS

| | | |
|---|---|---|
| 2014/0240088 A1* | 8/2014 | Robinette et al. ............ 340/5.61 |
| 2014/0252960 A1* | 9/2014 | Waser ............................ 315/151 |
| 2014/0253032 A1* | 9/2014 | Bruwer et al. ................. 320/108 |
| 2014/0354187 A1* | 12/2014 | Aggarwal et al. ............. 315/312 |

* cited by examiner

FIG. 3A

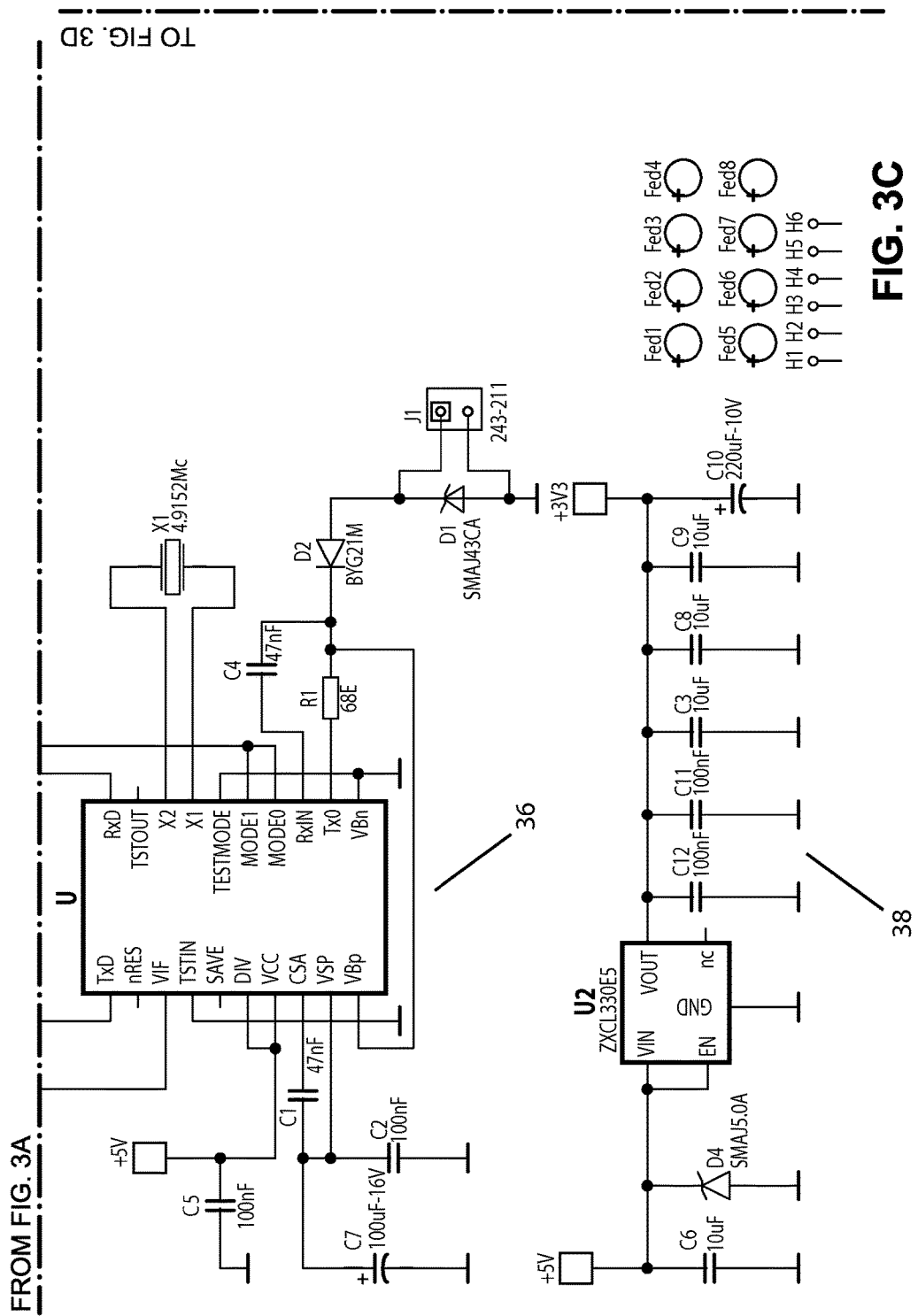

SWITCH

This application claims priority to BE Application No. 2012/0520 filed 26 Jul. 2012, the entire content of which is hereby incorporated by reference.

TECHNICAL FIELD

The invention relates to a contact switch for the operation of lighting.

TECHNOLOGICAL BACKGROUND TO THE INVENTION

Conventional light switches normally operate a limited number of light points. Even if a switch is able to operate a plurality of light points, this will be associated with a plurality of push-buttons or contact surfaces. If a large number of light points are operated, a specific identification must similarly be provided for each push-button and each contact surface. Identification of this type can be provided, for example, by means of a label. A large number of buttons of this type reduces the ease of use, increases production costs, increases the functional surface area of the switch and increases the risk of technical faults. Moreover, the installation is rather more complex, for both the user and the installer. Furthermore, if each button has to be specifically labelled, production costs will similarly rise and the installer will have to carry out additional work.

If a user wishes to change the ambience of the lighting in a room completely from one specific ambience to another by means of a suitable lighting scheme, this will normally be associated with a large number of actions of the user. These actions include not only the switching on and off of specific light points, but also the determination of the required light level of each light point (for example dimming), or the determination of the required light colour of each like point (for example using an RGB-LED).

There is a need for switches, primarily light switches, which simply and efficiently permit the switchover between different light schemes.

SUMMARY

In a first aspect, the invention comprises a switch (100), suitable for forwarding at least two functions to a lighting system, wherein the switch comprises the following elements:
- a sensor (10), configured to detect a contact;
- an illuminating element (20);
- an LED (22), wherein the LED (22) can assume a plurality of colours, and wherein the LED (22) is configured to illuminate the illuminating element (20); and
- an electronic circuit (30), configured to measure the time period of contact with the sensor (10), and configured to select a function from the at least two functions;

wherein the selection of a function from the at least two functions is dependent on the time period in which the sensor (10) is contacted, and wherein the colour of the LED (22) varies depending on the time period in which the sensor (10) is contacted.

In a preferred embodiment, the invention comprises a switch (100) according to the first aspect of the invention, wherein the electronic circuit (30) comprises the following elements:
- a contact-sensitive circuit (32), coupled to the sensor (10);
- a microprocessor (34), configured to measure the time period of contact; and
- a communications bus (36), configured to receive a signal from the microprocessor (34);

wherein the communications bus (36) forwards the selected function to the lighting system.

In a preferred embodiment, the invention comprises a switch (100) according to the first aspect of the invention, wherein the contact-sensitive circuit (32) comprises a capacitive circuit.

In a preferred embodiment, the invention comprises a switch (100) according to the first aspect of the invention, wherein the communications bus (36) is selected from the list comprising: KNX, LON, Can-bus, RS485 and BACNET, preferably KNX.

In a preferred embodiment, the invention comprises a switch (100) according to the first aspect of the invention, wherein the communications bus (36) is configured to receive a signal from the lighting system and forward it to the microprocessor (34).

In a preferred embodiment, the invention comprises a switch (100) according to the first aspect of the invention, wherein the selected function comprises the switching on and/or off of one or more light points and/or light circuits.

In a preferred embodiment, the invention comprises a switch (100) according to the first aspect of the invention, wherein the selected function comprises the switching on of a specific light ambience in the lighting system, preferably wherein a light ambience is determined by:
- a selection of switched on light points;
- a selection of switched off light points;
- optionally, the light level of switched on light points; and
- optionally, the light colour of switched on light points.

In a preferred embodiment, the invention comprises a switch (100) according to the first aspect of the invention, wherein the light ambience comprises one or more intelligent home applications.

In a preferred embodiment, the invention comprises a switch (100) according to the first aspect of the invention, wherein one of the at least two functions comprises the switching on and/or off of one or more light elements, and wherein another of the at least two functions comprises the switching on of a specific light ambience in the lighting system.

In a preferred embodiment, the invention comprises a switch (100) according to the first aspect of the invention, wherein the sensor (10) consists of metal, preferably aluminium or brass.

In a preferred embodiment, the invention comprises a switch (100) according to the first aspect of the invention, wherein the illuminating element (20) is translucent, preferably made from a glass or plastic, for example plexiglas or acrylate.

In a preferred embodiment, the invention comprises a switch (100) according to the first aspect of the invention, wherein the sensor (10) consists of a plurality of partial surfaces, each of which can send out a different electronic signal to the electronic circuit (30).

In a preferred embodiment, the invention comprises a switch (100) according to the first aspect of the invention, wherein contact with an individual partial surface controls individual light points or light circuits, while contact with two or more partial surfaces selects a light ambience.

In a second aspect, the invention similarly comprises a method for selecting a specific light ambience with a switch (100) according to one of claims 1 to 14, comprising the following steps:

a) recording of the contact with the sensor (10), by means of the electronic circuit (30);
b) controlling of the LED (22) with a periodic colour change by the electronic circuit (30), during contact with the sensor (10);
c) recording of the stopping of the contact with the sensor (10), by means of the electronic circuit (30);
d) determining of the time period of contact by the electronic circuit (30);
e) selecting of a function depending on the time period of contact by the electronic circuit (30); and
f) sending out of a signal with a selected function by the electronic circuit (30) to a lighting system.

In a preferred embodiment, the invention comprises a method according to the second aspect of the invention, wherein steps a) to e) are carried out by a microprocessor (34), and wherein step f) is carried out by a communications bus (36).

The invention provides a faster and intuitive way of changing the light ambience without having to search for the correct button. Furthermore, each light circuit can still be operated separately. The number of actions is thus limited and user-friendliness is considerably increased.

DESCRIPTION OF THE FIGURES

FIGS. 3A-3D illustrate a detailed representation of an electronic circuit (30) of a switch (100) according to a first aspect of the invention, with an indication of a contact-sensitive circuit (32), a microprocessor (34), a communications bus (36), an RGB-LED (22) and a power supply (38).

DETAILED DESCRIPTION

Figure 1:
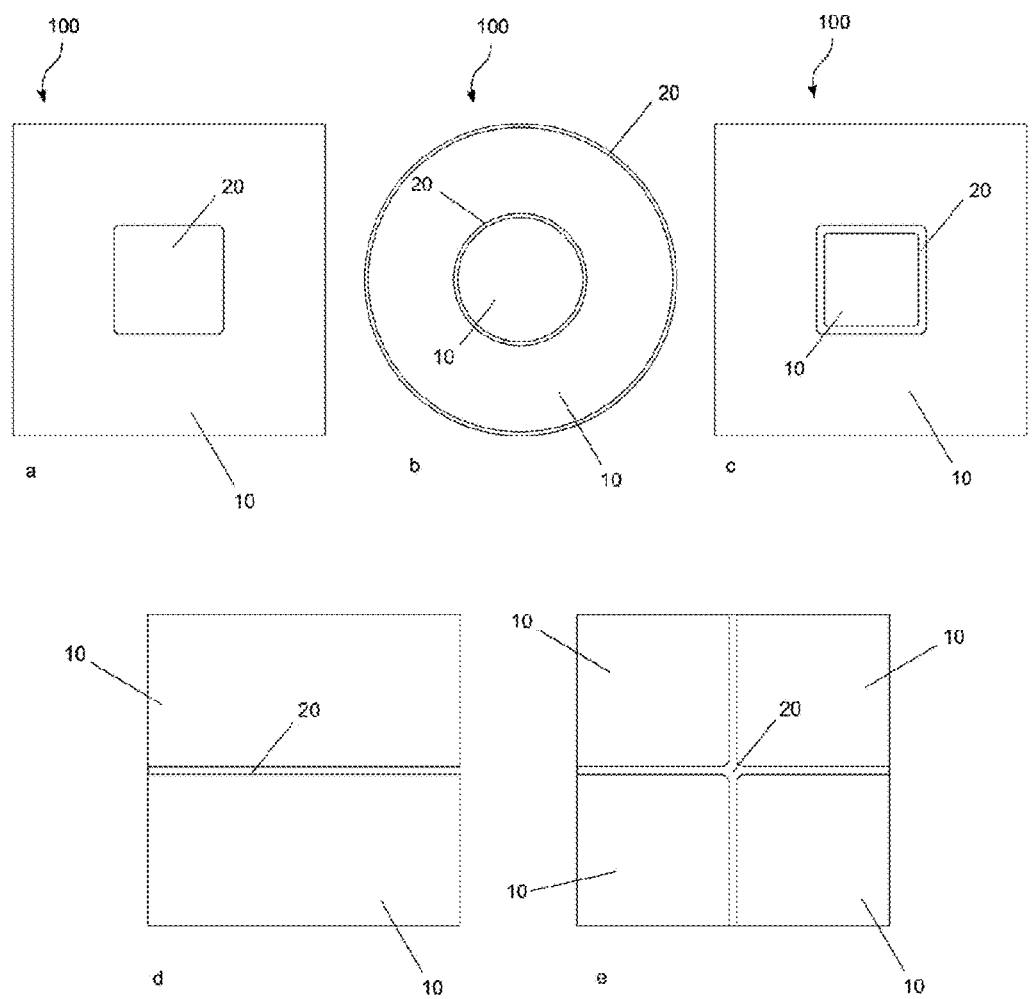
FIG. 1 illustrates a front view of five switches (100) according to a first aspect of the invention, with an indication of a sensor (10) and an illuminating element (20). The sensor (10) and the illuminating element (20) can comprise a plurality of surfaces of the switch (100), as illustrated in FIG. 1b-e.

As further used in this text, the singular forms "a" and "the" comprise both the singular and plural forms, unless the context clearly indicates otherwise.

The terms "comprise" and "comprises" as further used are synonymous with "including", "include" or "contain", "contains" and are inclusive or open and do not exclude unspecified members, elements or method steps. The terms "comprise" and "comprises" include the term "contain".

The listing of numerical values using number ranges comprises all values and fractions in these ranges, as well as the quoted endpoints.

The term "approximately", as used when reference is made to a measurable value such as a parameter, quantity, time period, etc., is intended to include variations of +/−10% or less, preferably +/−5% or less, more preferably +/−1% or less, and even more preferably +/−0.1% or less, of and as from the specified value, in so far as the variations apply to the functioning in the disclosed invention. It must be understood that the value to which the term "approximately" refers per se has also been disclosed.

All documents cited in the current specification are completely included herein by means of reference.

Unless otherwise defined, all terms disclosed in the invention, including technical and scientific terms, have the meaning as normally understood by a person skilled in the art. As a further guideline, definitions are included for further explanation of terms which are used in the description of the invention.

In a first aspect, the invention comprises a switch (100). The switch is preferably suitable for forwarding at least two functions to a lighting system. The switch according to the first aspect of the invention comprises the following elements:

a sensor (10), configured to detect a contact;
an illuminating element (20);
an LED (22), wherein the LED (22) can assume a plurality of colours, and wherein the LED (22) is configured to illuminate the illuminating element (20); and
an electronic circuit (30), configured to measure the time period of contact with the sensor (10), and configured to select a function from the at least two functions.

The selection of a function from the at least two functions is preferably dependent on the time period in which the sensor (10) is contacted. Furthermore, the colour of the LED (22) can also vary, depending on the time period in which the sensor (10) is contacted. In a preferred embodiment, the colour of the LED (22) is linked to the selection of a function.

The switch is preferably a light switch, more preferably a residential light switch, such as a light switch in a private dwelling or in an office building.

A switch (100) of this type allows a function to be selected from two or more functions by contacting the sensor (10) for a shorter or longer period. Furthermore, the LED (22) provides immediate feedback from the selected function, by varying the lighting colour of the illuminating element (20) depending on the time period in which the sensor (10) is contacted.

The switch (100) is preferably installed in the wall (300) via a flush-mounted socket (310).

The switch (100) preferably comprises a housing (2) and a cover panel (1). The housing (2) and a cover panel (1) can preferably be connected to one another, for example by clicking or screwing. In one embodiment, the cover panel (1) comprises a flat part which comprises the sensor (10). The illuminating element (20) is preferably located in the surface of the sensor (10). The illuminating element (20) can take up a part of the surface of the sensor (10), as shown in FIG. 1. The illuminating element (20) can also create a plurality of zones in the sensor (10). In FIG. 1a, the illuminating element (20) is located in a zone in the surface of the sensor (10). In FIG. 1b, the illuminating element (20) comprises two edges, hereby creating two zones of the sensor (10). In FIG. 1c, the illuminating element (20) comprises a bordering of a zone of the sensor (10), hereby creating two zones of the sensor (10).

Figure 2:
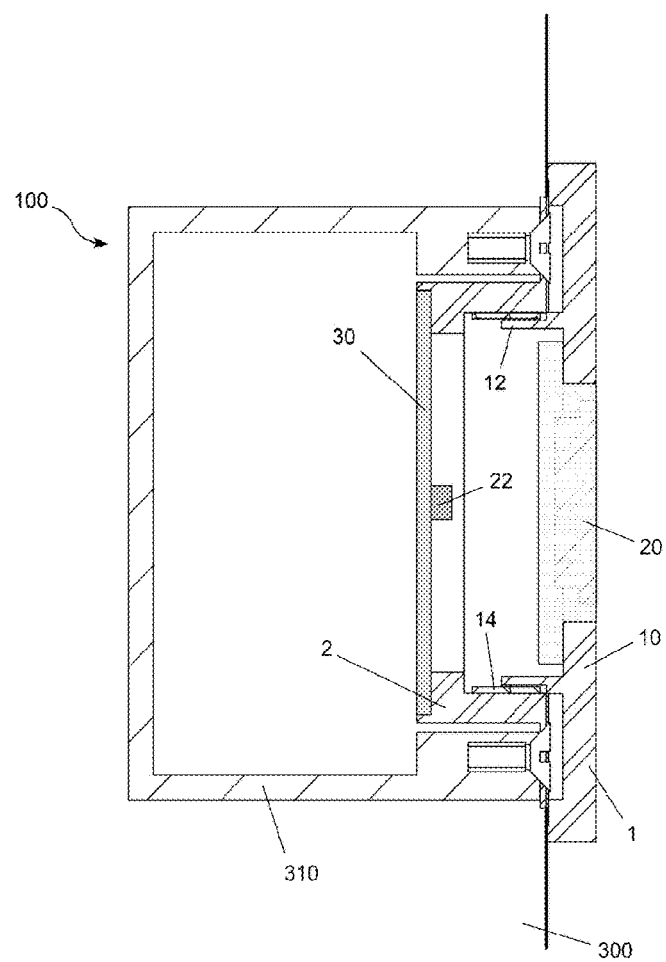
FIG. 2 illustrates a cross section of a switch (100) according to a first aspect of the invention, installed in a flush-mounted socket (310), the switch (100) comprising a housing (2) and a cover panel (1), with an indication of a sensor (10), an electrically conducting element (12), an electrically conducting screw thread (14), an electronic circuit (30), an illuminating element (20) and an RGB-LED (22).

FIG. 2 shows an example of a preferred embodiment of the switch (100). The switch (100) comprises a housing (2) and a cover panel (1). The switch (100) is installed in a flush-mounted socket (310), which is typically fitted into a wall (300). The housing (2) preferably comprises the electronic circuit (30), which preferably similarly comprises the LED (22). The housing (2) preferably also comprises an electrically conducting screw thread (14). This screw thread provides electronic contact between the housing (2) and the cover panel (1), which preferably similarly comprises an electrically conducting screw thread (14). In one embodiment, the electrically conducting screw thread (14) is made from aluminium. The electronic circuit (30) is in contact with the sensor (10) via an electrically conducting element (12). This electrically conducting element (12) is preferably made from aluminium. If contact is made with the sensor (10), a specific function is selected on the basis of the time period of the contact with the sensor (10). The LED (22) simultaneously illuminates the illuminating element (20), wherein the colour of the LED is dependent on the time period of the contact with the sensor (10), and is thus directly connected to the selected function.

The LED (22) is preferably an RGB LED. As a result, feedback can be given by means of an RGB LED (Light Emitting Diode) when a contact surface is contacted. In a preferred embodiment, the colour of the LED (22) changes with time as long as the sensor (10) is contacted. The electronic circuit (30) is preferably configured to control the LED (22) with a periodic colour change during contact with the sensor (10). This colour change can take place discretely or continuously. The LED (22) preferably changes colour discretely. Each colour preferably corresponds to a specific function. In total, the LED can assume at least 2 colours, for example 3, 4, 5, 6, 7, 8, 9 of 10. After passing through all of the colours, the cycle can start again. Possible suitable colours are white, red, orange, yellow, green, blue, indigo, violet, cyan, magenta. The colours are preferably selected from the list comprising: red, green, blue, yellow, cyan, magenta and orange. In a preferred embodiment, the colour of the LED (22) is linked to the selection of a function.

The LED (22) can assume any colour for a specified time period, and can then switch over to a new colour. This time period is preferably between 0.5 and 2.5 seconds, more preferably between 1.0 and 2.0 seconds, more preferably between 1.2 and 1.8 seconds, more preferably between 1.4 and 1.6 seconds, most preferably approximately 1.5 seconds.

In one embodiment, the light level of the LED (22) can also vary as well as the colour, depending on the time period in which the sensor (10) is contacted. In one embodiment, the switch (100) comprises a light sensor. The switch (100) can then light up automatically in the dark, as a result of which it is readily visible.

In a preferred embodiment, the electronic circuit (30) comprises the following elements:
a contact-sensitive circuit (32), coupled to the sensor (10);
a microprocessor (34), configured to measure the time period of contact; and
a communications bus (36), configured to receive a signal from the microprocessor (34).

In a preferred embodiment, the communications bus (36) forwards the selected function to the lighting system.

Figure 3A:
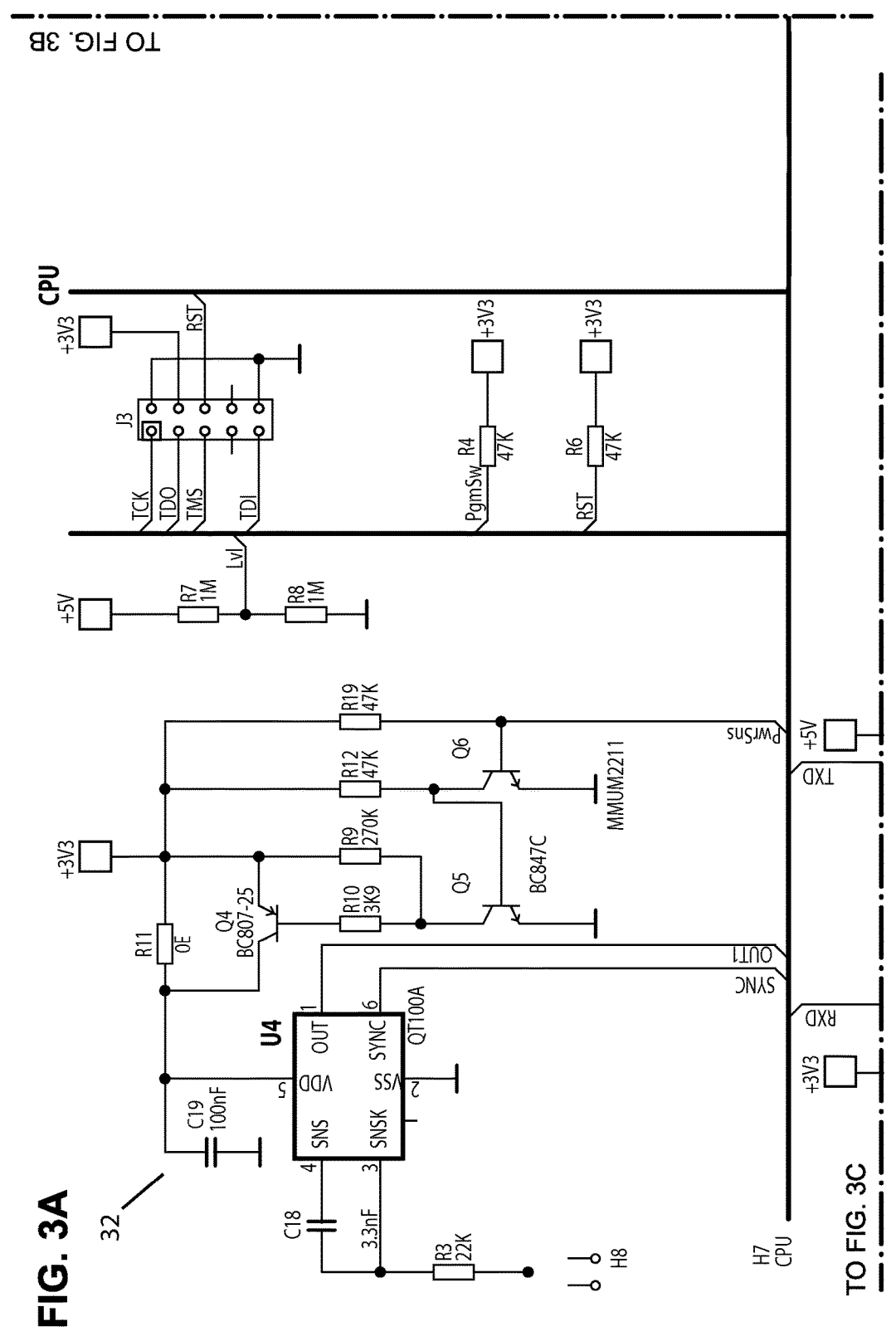
Figure 3B:
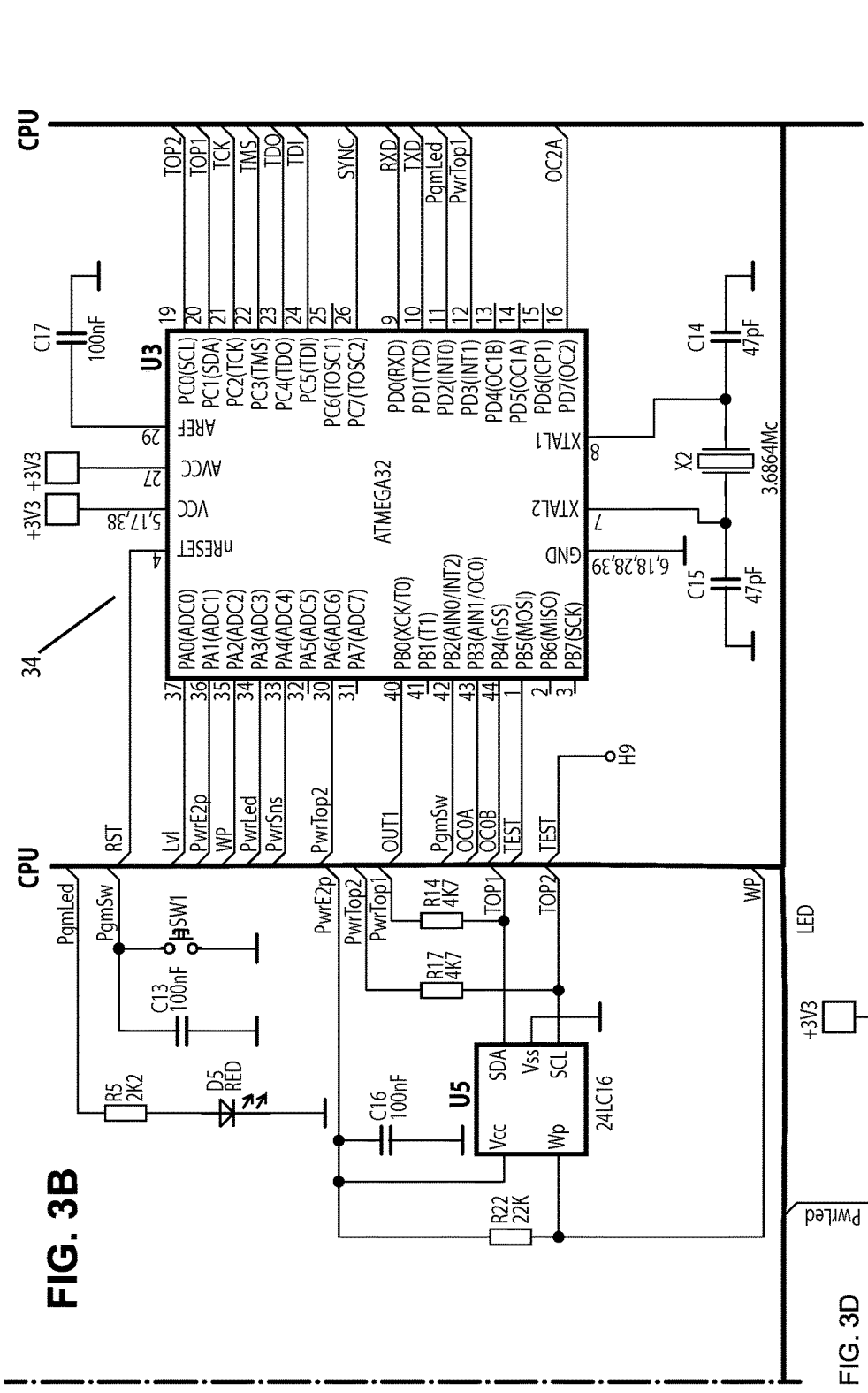
Figure 3D:
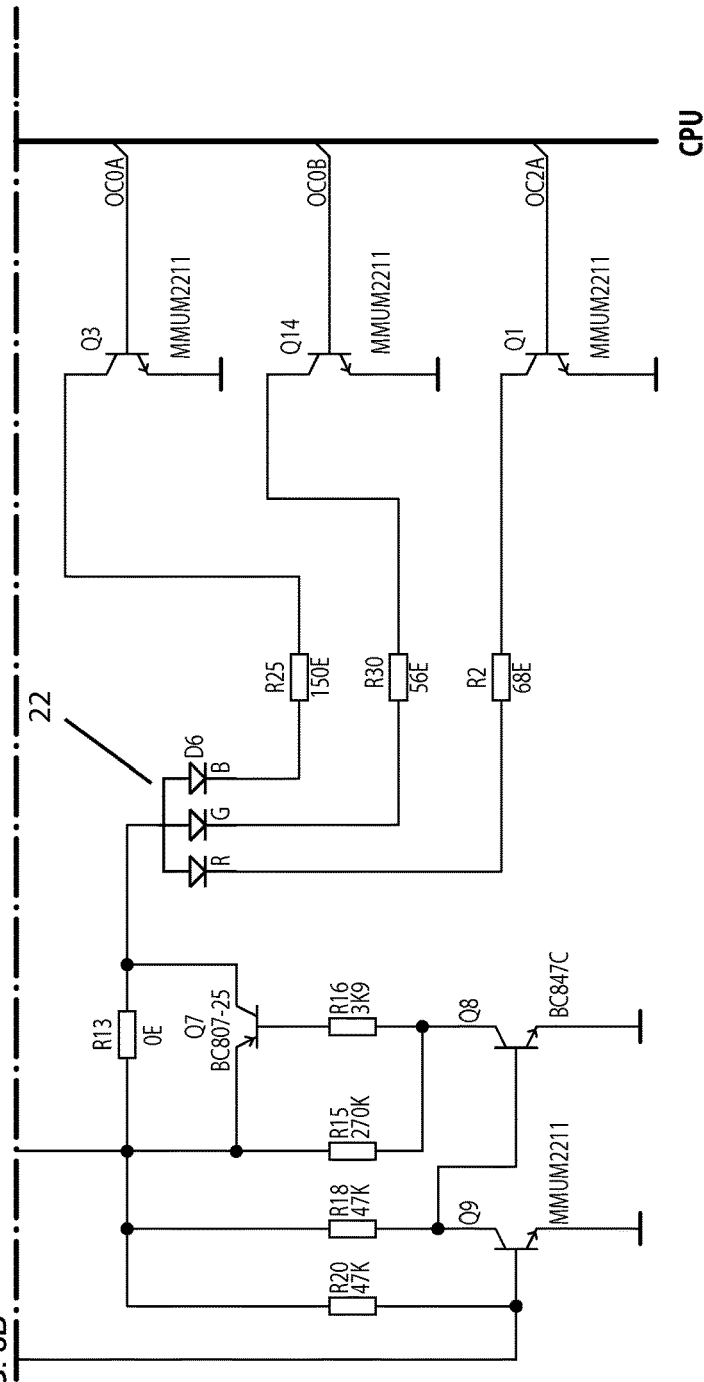

The electronic circuit (30) preferably comprises a power supply (38) also. The LED (22) can also form part of the electronic circuit (30). An example of an electronic circuit (30) is shown in FIG. 3.

In a preferred embodiment, the contact-sensitive electronic switch (32) comprises a capacitive circuit. In an embodiment of this type, the contact is detected by an electronic circuit of the capacitive type, which is set as sufficiently sensitive so that only a light contact is necessary. The contact is preferably detected without exerting pressure or force, wherein contact is made only with the skin. If the finger or the hand is large enough, the circuit can already detect this if the hand is a few millimeters away. Contact is preferably detected on the entire surface of the sensor (10), preferably both at the centre of the sensor (10) and up into any angular points. Alternatives to a capacitive circuit are a piezo-electric element, a pressure-sensitive element or an optical sensor. In this last case, no physical contact is needed for "contact" to take place.

In a preferred embodiment, the communications bus (36) is selected from the list comprising: KNX, LON, Can-bus, RS485 and BACNET. The communications bus (36) preferably complies with the KNX protocol. In one embodiment, the communications bus (36) uses an Internet Protocol (IP), e.g. via the Internet. In one embodiment, the communication takes place wirelessly.

In a preferred embodiment, the selected function comprises the switching on and/or off of one or more light points of light circuits. A function can comprise the switching on of a light element. A function can comprise the switching off of a light element. A function can comprise the switching on of a plurality of light elements. A function can comprise the switching off of a plurality of light elements. A function can comprise the switching on of one or more light elements and the switching off of one or more light elements.

In a preferred embodiment, the selected function comprises the switching on of a specific light ambience in the lighting system. A light ambience can be determined by:
a selection of switched on light points;
a selection of switched off light points;
optionally, the light level of switched on light points; and
optionally, the light colour of switched on light points.

In a preferred embodiment, the light ambience comprises one or more intelligent home applications. Intelligent home applications of this type comprise the control of curtains, shutters, doors, room temperature, water temperature, audio, video, multimedia or other functions in a dwelling. The colour of the LED (22) can give an indication of light ambience, wherein, for example, blue generates a cooler light ambience, whereas red generates a warmer light ambience.

In a preferred embodiment, one of the at least two functions comprises the switching on and/or off of one or more light elements, and another of the at least two functions comprises the switching on of a specific light ambience in the lighting system. A short contact with the sensor (10) can, for example, switch one or more light elements on or off. A short contact with the sensor (10) can, for example, switch off all light elements. A long contact with the sensor (10) can, for example, offer the facility to select a plurality of light ambiences.

The term "short contact" is understood here to mean a contact of less than 2.0 seconds, preferably less than 1.5 seconds, preferably less than 1.4 seconds, for example less than 1.2 seconds, for example less than 1.0 seconds. The term "long contact" is understood here to mean a contact which is longer than a short contact, such as a contact of at least 2.0 seconds.

In one embodiment, extremely short contacts are filtered out (debounce). The term "extremely short contact" is understood here to mean a contact of less than 0.200 seconds, preferably less than 0.100 seconds, preferably less than 0.075 seconds, preferably less than 0.060 seconds, preferably less than 0.050 seconds, preferably approximately 0.040 seconds (40 ms).

In a preferred embodiment, the communications bus (36) is configured to receive a signal from the lighting system and forward it to the microprocessor (34). In an embodiment of this type, the communications bus (36) can indicate to the microprocessor which light points are already switched on or off. In this way, a specific time period of contact, for example a short contact, can transmit the signal to switch these light points on or off.

In a preferred embodiment, the sensor (10) consists of metal, preferably aluminium or brass. In one embodiment, the sensor (10) also comprises a coating, for example of nickel or gold. In one embodiment, the sensor (10) has been subjected to a surface treatment. In one embodiment, this surface treatment is selected from the list comprising: lacquering, anodising, bronze-plating, nickel-plating, chrome-plating or gold-plating.

In a preferred embodiment, the illuminating element (20) is translucent or transparent, preferably translucent. In a preferred embodiment, the illuminating element (20) consists of a glass or plastic. Examples of suitable plastics are plexiglass (poly(methyl methacrylate)) and acrylate.

In a preferred embodiment, the sensor (10) consists of a plurality of partial surfaces which each send out a different electronic signal to the electronic circuit (30). The switch in an embodiment of this type comprises a plurality of partial surfaces (or contact surfaces), for example 2, 3, 4, 5, 6 or more, preferably 2 or 4. These surfaces can themselves each control a different function. Each surface can, for example, correspond to a different light circuit, for example the switching on and off of a different light circuit. FIG. 1b-e shows a switch (100) with 2 or 4 partial surfaces. These can have the same function (as in FIGS. 1b and 1c), or a different function (as in FIGS. 1d and 1e). One of the partial surfaces can have a function of switching a light point, light circuit or the entire lighting system on and off, while another partial surface selects a light ambience.

In a preferred embodiment, the contact with an individual partial surface controls individual light points or light circuits, while contact with two or more partial surfaces selects a light ambience.

In one embodiment, the contact with two or more partial surfaces is detected if the partial surfaces are contacted simultaneously. In one embodiment, the contact with two or more partial surfaces is detected if the partial surfaces are contacted within a specific time after one another. This specific time is preferably less than 1.0 seconds, preferably less than 0.5 seconds, preferably less than 0.4 seconds, preferably less than 0.3 seconds, preferably approximately 0.2 seconds (200 ms). The selecting of a light ambience can, as described above, take place depending on the time period in which the partial surfaces are contacted.

In a second aspect, the invention comprises a method for selecting a specific light ambience with a switch (100) according to the first aspect of the invention, comprising the following steps:
a) recording of the contact with the sensor (10), by means of the electronic circuit (30);
b) controlling of the LED (22) with a periodic colour change by the electronic circuit (30), during contact with the sensor (10);
c) recording of the stopping of the contact with the sensor (10), by means of the electronic circuit (30);
d) determining of the time period of contact by the electronic circuit (30);
e) selecting of a function depending on the time period of contact by the electronic circuit (30); and
f) sending out of a signal with a selected function by the electronic circuit (30) to a lighting system.

In a preferred embodiment, the steps a) to e) are carried out by a microprocessor (34) and step f) is carried out by a communications bus (36).

Figure 4:
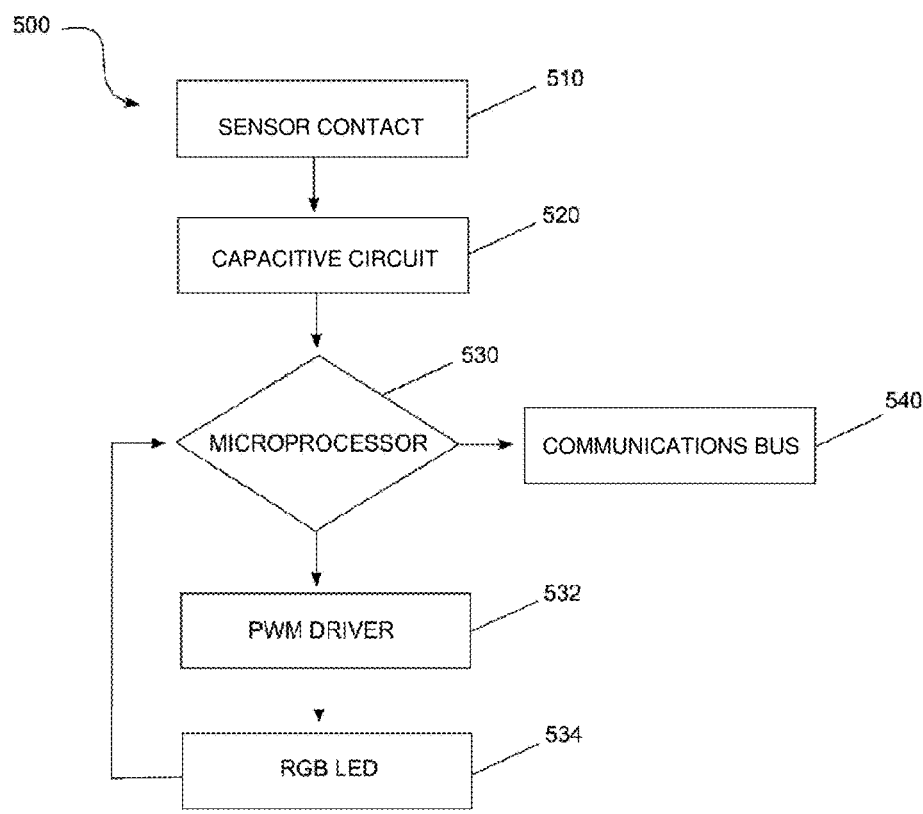
FIG. 4 illustrates the schematic operation of a method (500) according to a second aspect of the invention.

FIG. 4 shows an embodiment of a method (500) of this type as a flow diagram. In the event of contact (510) with the sensor (10), a capacitive circuit (32) sends (520) a signal to the microprocessor (34). This microprocessor (34) monitors via the capacitive circuit (32) how long the sensor (10) is contacted. As long as the sensor (10) is contacted, the microprocessor (34) sends (532) a signal to a PWM driver, which controls (534) the LED (22), wherein the LED (22) periodically changes colour. If the microprocessor (34) receives no signal of contact with the sensor (10), the microprocessor sends (540) a signal to the communications bus (36) for the selection of the correct function, depending on the time period in which the sensor (10) was contacted.

The invention claimed is:
1. Switch, suitable for forwarding at least two functions to a lighting system, wherein the switch comprises the following elements:
a sensor, configured to detect a contact;
an illuminating element;
an LED, wherein the LED can assume a plurality of colours, and wherein the LED is configured to illuminate the illuminating element; and
an electronic circuit, configured to measure the time period of contact with the sensor, and configured to select a function from the at least two functions;
wherein the selection of a function from the at least two functions is dependent on the time period in which the sensor is contacted, and wherein the colour of the LED varies depending on the time period in which the sensor is contacted, wherein the electronic circuit is configured to control the LED with a periodic colour change in a repeating cycle during contact with the sensor.

2. Switch according to claim 1, wherein the electronic circuit comprises the following elements:
a contact-sensitive circuit, coupled to the sensor;
a microprocessor, configured to measure the time period of contact; and
a communications bus, configured to receive a signal from the microprocessor;
wherein the communications bus forwards the selected function to the lighting system.

3. Switch according to claim 2, wherein the contact-sensitive circuit comprises a capacitive circuit.

4. Switch according to claim 2, wherein the communications bus is selected from the list comprising: KNX, LON, Can-bus, RS485 and BACNET.

5. Switch according to claim 2, wherein the communications bus is configured to receive a signal from the lighting system and forward it to the microprocessor.

6. Switch according to claim 1, wherein the selected function comprises the switching on and/or off of one or more light points and/or light circuits.

7. Switch according to claim 1, wherein the selected function comprises the switching on of a specific light ambience in the lighting system.

8. Switch according to claim 7, wherein the light ambience comprises one or more intelligent home applications.

9. Switch according to claim 6, wherein one of the at least two functions comprises the switching on and/or off of one or more light elements, and wherein another of the at least two functions comprises the switching on of a specific light ambience in the lighting system.

10. Switch according to claim 1, wherein the sensor consists of metal.

11. Switch according to claim 1, wherein the illuminating element is translucent.

12. Switch according to claim 1, wherein the sensor consists of a plurality of partial surfaces which each send out a different electronic signal to the electronic circuit.

13. Switch according to claim 12, wherein contact with an individual partial surface controls individual light points or light circuits, while contact with two or more partial surfaces selects a light ambience.

14. Method for selecting a specific light ambience with a switch according to claim 1, comprising the following steps:
   a) recording of the contact with the sensor, by means of the electronic circuit;
   b) controlling of the LED with a periodic colour change in a repeating cycle by the electronic circuit, during contact with the sensor;
   c) recording of the stopping of the contact with the sensor, by means of the electronic circuit;
   d) determining of the time period of contact by the electronic circuit;
   e) selecting of a function depending on the time period of contact by the electronic circuit; and
   f) sending out of a signal with a selected function by the electronic circuit to a lighting system.

15. Method according to claim 14, wherein steps a) to e) are carried out by a microprocessor and step f) is carried out by a communications bus.

* * * * *